US012648361B2

(12) United States Patent
Wu et al.

(10) Patent No.: US 12,648,361 B2
(45) Date of Patent: Jun. 2, 2026

(54) SEMICONDUCTOR STRUCTURE AND FORMING METHOD THEREOF

(71) Applicant: UNITED MICROELECTRONICS CORP., Hsin-Chu City (TW)

(72) Inventors: Jia-Rong Wu, Kaohsiung City (TW); I-Fan Chang, Tainan City (TW); Rai-Min Huang, Taipei City (TW); Po-Kai Hsu, Tainan City (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 394 days.

(21) Appl. No.: 18/203,642

(22) Filed: May 30, 2023

(65) Prior Publication Data

US 2024/0373754 A1      Nov. 7, 2024

(30) Foreign Application Priority Data

May 4, 2023      (TW) ................................. 112116566

(51) Int. Cl.
*H10N 50/01*      (2023.01)
*H10N 50/80*      (2023.01)

(52) U.S. Cl.
CPC ............. *H10N 50/01* (2023.02); *H10N 50/80* (2023.02)

(58) Field of Classification Search
CPC ........ H10N 50/80; H10N 50/10; H10N 59/00; H10B 61/00; H10B 61/22
See application file for complete search history.

(56) References Cited

U.S. PATENT DOCUMENTS 9,040,405 B2      5/2015  Hasche
2022/0059618 A1*  2/2022  Hsu ........................ H10B 63/80

* cited by examiner

*Primary Examiner* — Shih Tsun A Chou
(74) *Attorney, Agent, or Firm* — Winston Hsu

(57)      ABSTRACT

The invention provides a semiconductor structure, which comprises a plurality of magnetic tunnel junction (MTJ) elements. Seen from a top view, the MTJ elements are arranged in an array, at least one second contact structure is located in the array arranged by the MTJ elements, and at least one first mask layer covers a top surface and two sidewalls of each MTJ element, when seen from a cross-sectional view, a sidewall of the first mask layer is aligned with a sidewall of a second metal layer which is disposed below the second contact structure.

7 Claims, 10 Drawing Sheets

SEMICONDUCTOR STRUCTURE AND FORMING METHOD THEREOF

BACKGROUND OF THE INVENTION

1. Field of the Invention

The invention relates to the field of semiconductors, in particular to an arrangement pattern of contact structures with magnetic tunneling junction (MTJ) elements and a forming method thereof.

2. Description of the Prior Art

Magnetoresistance (MR) effect has been known as a kind of effect caused by altering the resistance of a material through variation of outside magnetic field. The physical definition of such effect is defined as a variation in resistance obtained by dividing a difference in resistance under no magnetic interference by the original resistance. Currently, MR effect has been successfully utilized in production of hard disks thereby having important commercial values. Moreover, the characterization of utilizing GMR materials to generate different resistance under different magnetized states could also be used to fabricate MRAM devices, which typically has the advantage of keeping stored data even when the device is not connected to an electrical source.

The aforementioned MR effect has also been used in magnetic field sensor areas including but not limited to for example electronic compass components used in global positioning system (GPS) of cellular phones for providing information regarding moving location to users. Currently, various magnetic field sensor technologies such as anisotropic magnetoresistance (AMR) sensors, GMR sensors, magnetic tunneling junction (MTJ) sensors have been widely developed in the market. Nevertheless, most of these products still pose numerous shortcomings such as high chip area, high cost, high power consumption, limited sensibility, and easily affected by temperature variation and how to come up with an improved device to resolve these issues has become an important task in this field.

SUMMARY OF THE INVENTION

The invention provides a semiconductor structure, which comprises a plurality of magnetic tunnel junction (MTJ) elements. Seen from a top view, the MTJ elements are arranged in an array, at least one second contact structure is located in the array arranged by the MTJ elements, and at least one first mask layer covering a top surface and two sidewalls of each MTJ element, wherein a sidewall of the first mask layer is aligned with a sidewall of a second metal layer below the second contact structure when viewed from a cross-section view.

The invention also provides a method for forming a semiconductor structure, which comprises forming a plurality of magnetic tunnel junction (MTJ) elements, which are arranged in an array from a top view, forming at least one second metal layer in the array of the MTJ elements, forming a first mask layer to cover each of the MTJ elements and a top surface of the second metal layer, forming a second mask layer covering the first mask layer, performing a first etching step to remove the second mask layer disposed on the second metal layer, and performing a second etching step to remove the first mask layer disposed on the second metal layer and expose the top surface of the second metal layer.

In order to arrange the MTJ elements and the second contact structure more closely, the invention designs a special arrangement pattern of the MTJ element array and the second contact structure. The second contact structure is arranged in the lateral gap between the MTJ elements, and the size of the original array of MTJ elements is not changed. However, the short spacing of the pattern is easy to cause exposure defects in the process, so the invention also proposes a double patterning and cutting method. By the method of the invention, a closely spaced array of MTJ elements and contact structures can be formed without causing defects in element exposure.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
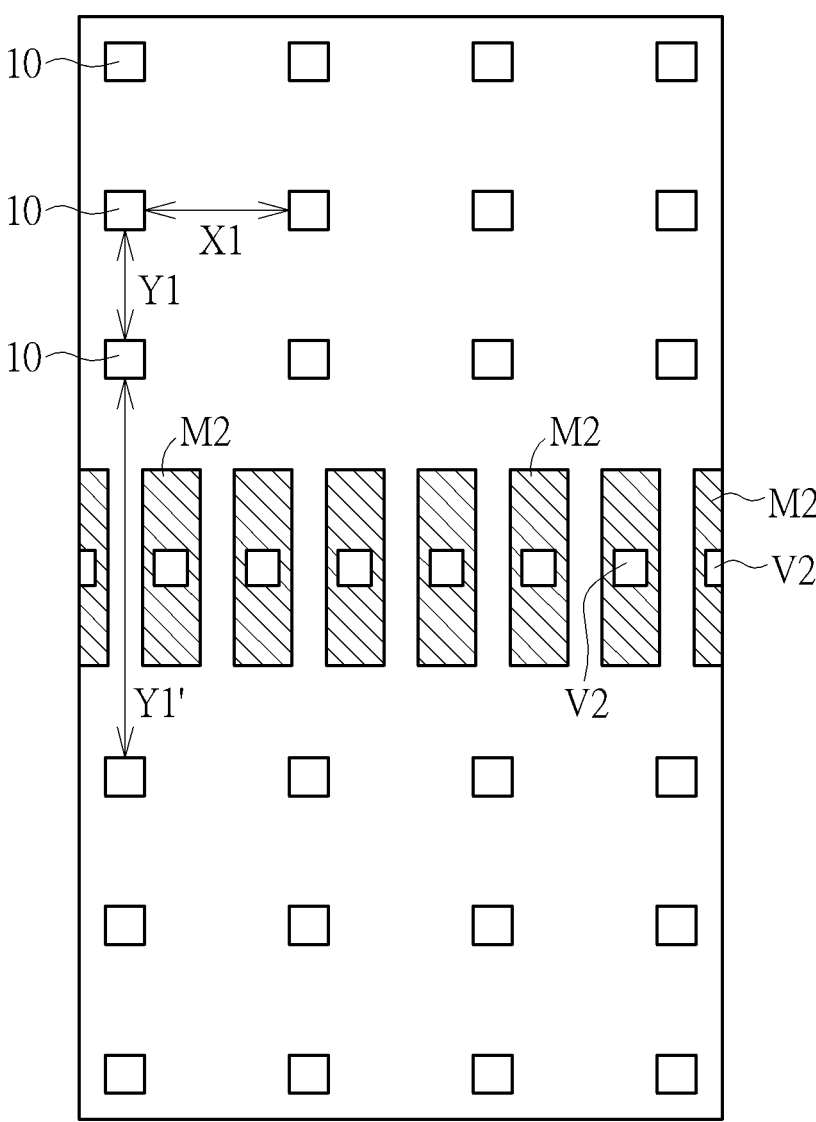
FIG. 1 is a schematic diagram showing the arrangement of an MTJ element, a second metal layer and a contact structure according to a first embodiment of the present invention.

Please refer to FIG. 1, which is a schematic diagram showing the arrangement of an MTJ element, a second metal layer and a contact structure according to a first embodiment of the present invention. First, a plurality of magnetic tunnel junction (MTJ) elements 10 are formed in one layer of a semiconductor stacked structure, and the MTJ elements are arranged in an array (matrix). In addition, a plurality of second contact structures V2 are arranged beside the MTJ element 10. In this embodiment, the MTJ element 10 and the second contact structure are both formed on one of the metal layers in the semiconductor structure, for example, the second lateral metal wire layer from bottom to top in the process, which is often referred to as the second metal layer (M2) for short. However, the present invention is not limited to this. In fact, the MTJ element 10 and the second contact structure V2 can be formed on other metal layers in the semiconductor structure, such as the first metal layer (M1) or the third metal layer (M3), which are within the scope of the present invention.

Figure 2:
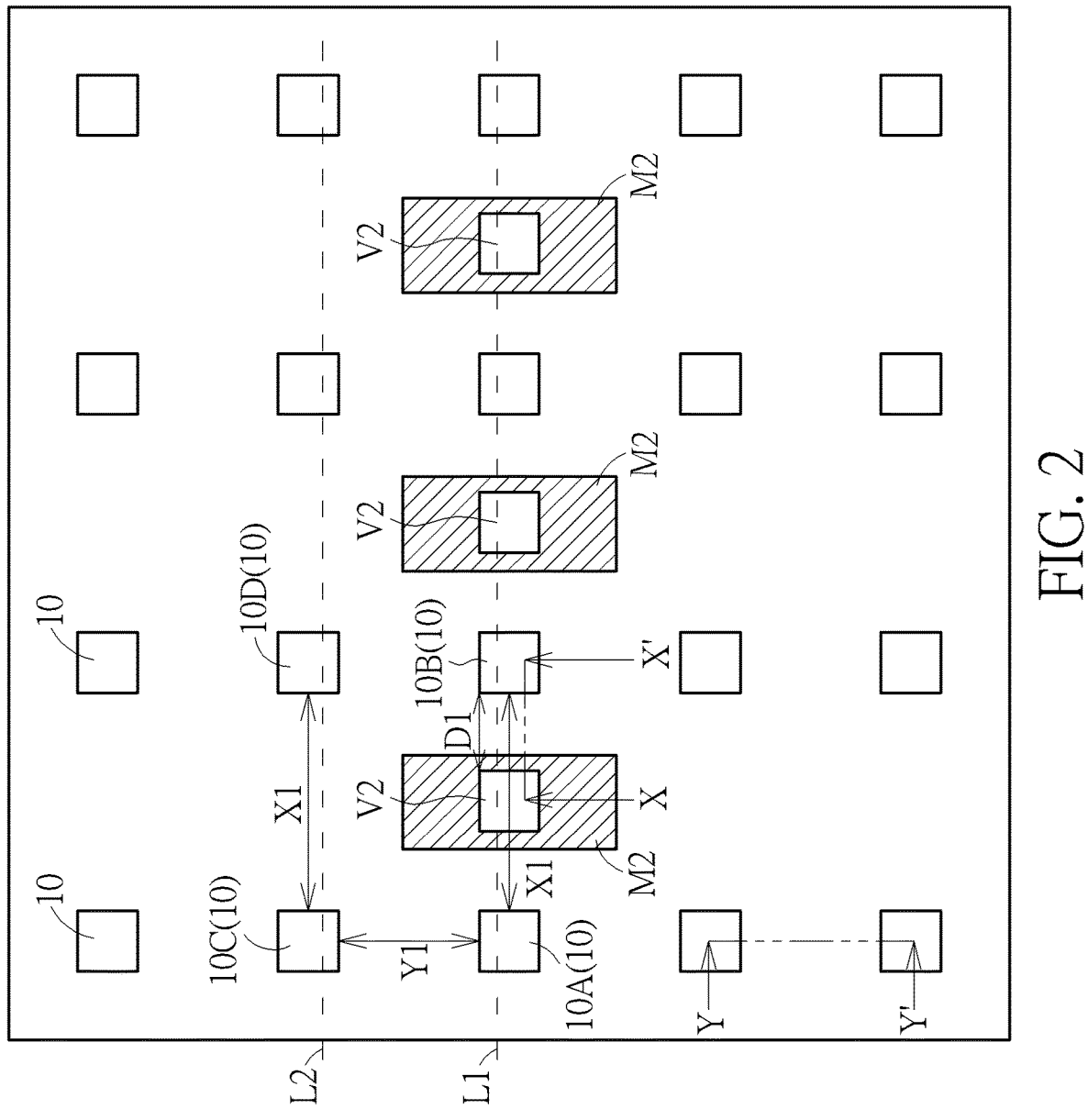
FIG. 2 is a schematic diagram showing the arrangement of the MTJ element, the second metal layer and the contact structure according to the second embodiment of the present invention.

The second contact structure V2 can be connected to other electronic components, such as, but not limited to, connecting electronic components in logic areas such as word lines and transistors. In this embodiment, the second contact structure V2 is inserted between the arrays of the MTJ elements 10. Since the second contact structure V2 must be formed, it is necessary to adjust the spacing distance of the original array of MTJ elements 10 to accommodate the second contact structure V2. For example, as shown in FIG. 1, the horizontal spacing between the original MTJ elements 10 is X1 and the vertical spacing is Y1 (along the X direction and the Y direction in FIG. 1, respectively). However, since a plurality of second contact structures V2 are inserted in the array of MTJ elements 10, the spacing between some MTJ elements 10 is lengthened to Y1', where Y1' is greater than Y1. In this way, a certain space must be reserved to accommodate the second In another embodiment of the present invention, the position of the second contact structure V2 is adjusted to be more closely arranged within the array of the MTJ elements 10. Different from the above-mentioned first embodiment, the second contact structure V2 is located in the gap between adjacent MTJ elements 10 in the lateral direction, so the arrangement as shown in FIG. 2 will not increase the gap between the MTJ elements 10 due to the insertion of the second contact structure V2. Specifically, some of the MTJ elements 10 in FIG. 2 can be defined as an MTJ element 10A, an MTJ element 10B, an MTJ element 10C and an MTJ element 10D, respectively. Among them, the MTJ element 10A and the MTJ element 10C are located in the same column (aligned with each other along the Y-axis), the MTJ element 10B and the MTJ element 10D are located in the same column (aligned with each other along the Y-axis), the MTJ element 10A and the MTJ element 10B are located in the same row (aligned with each other along the X-axis), and the MTJ element 10C and the MTJ element 10D are located in the same row (aligned with each other along the X-axis). In this embodiment, the second contact structure V2 is located between the MTJ element 10A and the MTJ element 10B in the lateral direction (i.e., the X direction), but it is not located between the MTJ element 10C and the MTJ element 10D in the lateral direction. Therefore, the distance between the MTJ element 10A and the MTJ element 10B in the lateral direction is equal to the pitch X1 of the above-mentioned first embodiment, and the distance between the MTJ element 10C and the MTJ element 10D in the lateral direction is also equal to the pitch X1 of the above-mentioned first embodiment. Moreover, in this embodiment, the longitudinal spacing between any adjacent two MTJ elements 10 are Y1. In other words, in FIG. 2, the distance between any two adjacent MTJ elements 10 is not Y1' (as shown in FIG. 1).

The arrangement in the above-mentioned FIG. 2 is beneficial to reduce the overall size of the element. However, in the actual manufacturing process, because the elements are arranged more closely, some difficulties may be encountered in the manufacturing process. For example, when the spacing between the elements is small, for example, when the distance D1 between the MTJ element 10 and the second contact structure V2 in FIG. 2 is less than about 50 nm, it is easier to encounter exposure problems when forming the pattern of the second contact structure V2 with the current manufacturing technology. For example, when the mask (not shown) on the surface of the second contact structure V2 needs to be removed, it may affect the neighboring MTJ elements, such as contamination in the process, or the exposure range is set small when forming the second contact structure V2, so it is easy to cause problems such as exposure failure or pattern deformation.

In order to arrange the MTJ element and the second contact structure more closely, but at the same time, it is necessary to solve the above exposure problem. The invention provides a double patterning method to form the element pattern with special arrangement as shown in FIG. 2, which has the advantages of improving the element quality and reducing the element size. Details are shown in the following paragraphs.

Figure 3:
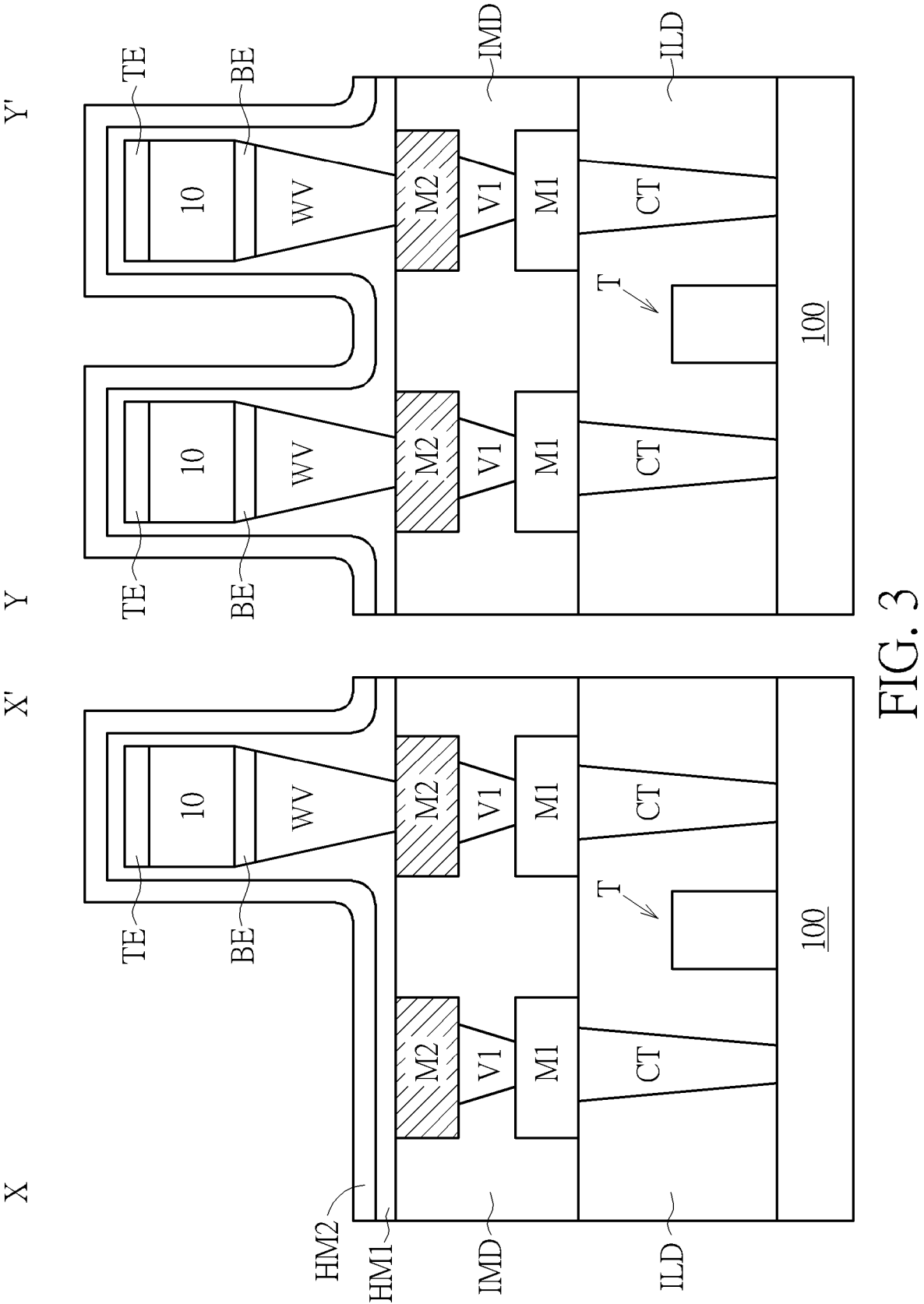
FIG. 3 is a schematic view of the sectional structure taken along the section line A-A' and section line B-B' in FIG. 2.

FIG. 3 is a schematic view of the sectional structure taken along the section line A-A' and section line B-B' in FIG. 2. As shown in FIG. 3, it includes a substrate 100, for example, a substrate 100 made of a semiconductor material, wherein the semiconductor material can be selected from the group consisting of silicon, germanium, silicon-germanium composite, silicon carbide, gallium arsenide, etc.

The substrate 100 may include active elements such as a metal-oxide semiconductor (MOS) transistors, passive elements, conductive layers and dielectric layers such as inter-layer dielectrics (ILD) covering it. More specifically, the substrate 100 may include planar or non-planar MOS transistors T (such as fin structure transistors), each MOS transistor T may include a gate structure (such as a metal gate) and source/drain regions, spacers, epitaxial layers, contact hole etching stop layers, etc. The interlayer dielectric ILD may be disposed on the substrate 100 and cover the MOS transistor T. and the interlayer dielectric ILD may have a plurality of contact plugs CT for electrical connection. Because the related processes of planar or non-planar transistors and interlayer dielectrics are well known in the art, they will not be described here.

Then, an inter-metal dielectric IMD is formed on the inter-layer dielectric layer ILD, and a contact plug CT for electrically connecting a first metal layer M1, a first contact structure V1 and a second metal layer M2 in sequence is formed in the inter-metal dielectric layer inter-metal dielectric IMD. In this embodiment, the first contact structures V1 can be embedded in the IMD and electrically connected to each other according to a single damascene process or a dual damascene process. For example, the first contact structure V1 can include a barrier layer (not shown) and a metal layer in detail, the barrier layer can be selected from the group consisting of titanium (Ti), titanium nitride (TiN), tantalum (Ta) and tantalum nitride (TaN), and the metal layer can be selected from tungsten (W), copper (Cu), aluminum (Al), titanium aluminum alloy (TiAl) and titanium aluminum alloy. As the single damascene or dual damascene process is a well-known technology in the field, it will not be described here. In addition, in this example, the metal of the first metal layer M1, the second metal layer M2 or the subsequently formed third metal layer M3 preferably contains metals with good conductivity such as copper and tungsten. The inter-layer dielectric layer ILD and the intermetallic dielectric layer IMD preferably comprise silicon oxide or ultra-low dielectric constant dielectric layers, but are not limited thereto.

Next, a contact structure WV may be formed on a part of the second metal layer M2, the contact structure is made of tungsten, for example, but not limited thereto. Then, a bottom electrode BE, an MTJ element 10 and a top electrode TE are sequentially formed on the contact structure WV. Among them, the bottom electrode layer BE and the top electrode TE preferably contain conductive materials, such as but not limited to tantalum (Ta), platinum (Pt), copper (Cu), gold (Au), aluminum (Al) or their combinations. The MTJ element 10 described here is equivalent to the MTJ element 10 described in FIGS. 1-2, and the MTJ element 10 may be a stacked structure consisting of a pinned layer, a barrier layer and a free layer, which is located between the bottom electrode BE and the top electrode TE. The pinned layer may include ferromagnetic materials such as but not limited to cobalt-iron-boron (CoFeB), iron (Fe), cobalt (Co), etc., to fix or limit the magnetic moment direction of adjacent layers. The barrier layer may be composed of an insulating material containing oxides, such as aluminum oxide (AlOx) or magnesium oxide (MgO), but it is not limited thereto. The free layer including the first free layer and the second free layer can be made of ferromagnetic materials, such as iron, cobalt, nickel or their alloys such as cobalt-iron-boron (CoFeB) and nickel-iron (NiFe), but not limited to this. Among them, the magnetization direction of the free layer will be "freely" changed by the external magnetic field. Other materials or manufacturing methods of the contact structure WV and the MTJ element 10 belong to the conventional technology in the field, and they will not be described here.

As shown in FIG. 3, a first mask layer HM1 and a second mask layer HM2 are further formed to cover the second metal layer M2 and the MTJ element 10. The materials of the first mask layer HM1 and the second mask layer HM2 are different, for example, the first mask layer HM1 is made of silicon nitride and the second mask layer HM2 is made of titanium nitride (TiN), but the present invention is not limited to this. In the next step, a second contact structure (equivalent to the second contact structure V2 in FIG. 2) will be formed on the top surface of the second metal layer M2 next to the MTJ element 10 in the X direction. In order for the second contact structure to be electrically connected with the second metal layer M2, it is necessary to remove the first mask layer HM1 and the second mask layer HM2 on the top surface of the second metal layer M2 without affecting the MTJ element 10.

Figure 4:
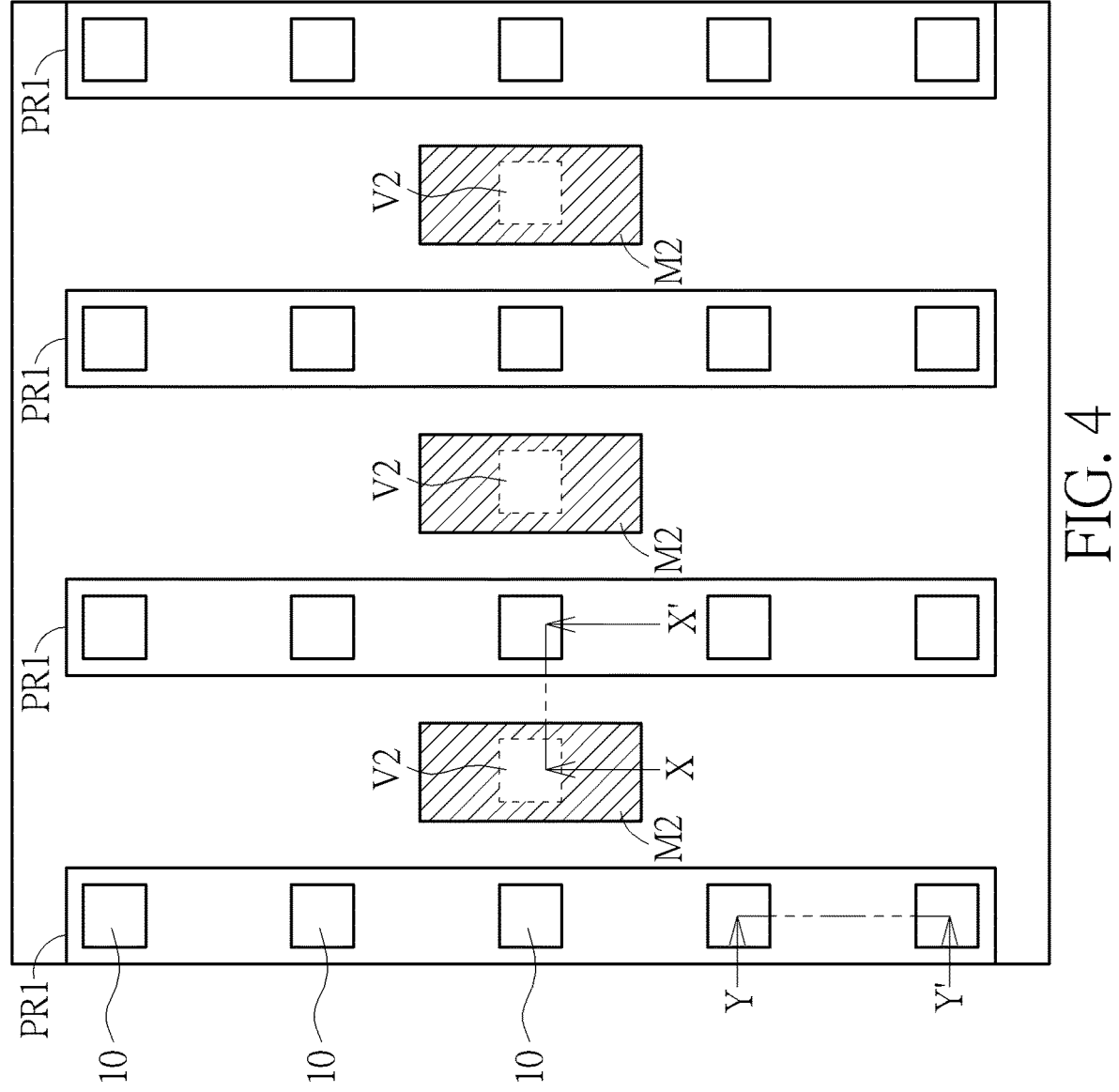
FIG. 4 is a schematic top view of the semiconductor structure after the first photoresist layer is formed in the present invention.
Figure 5:
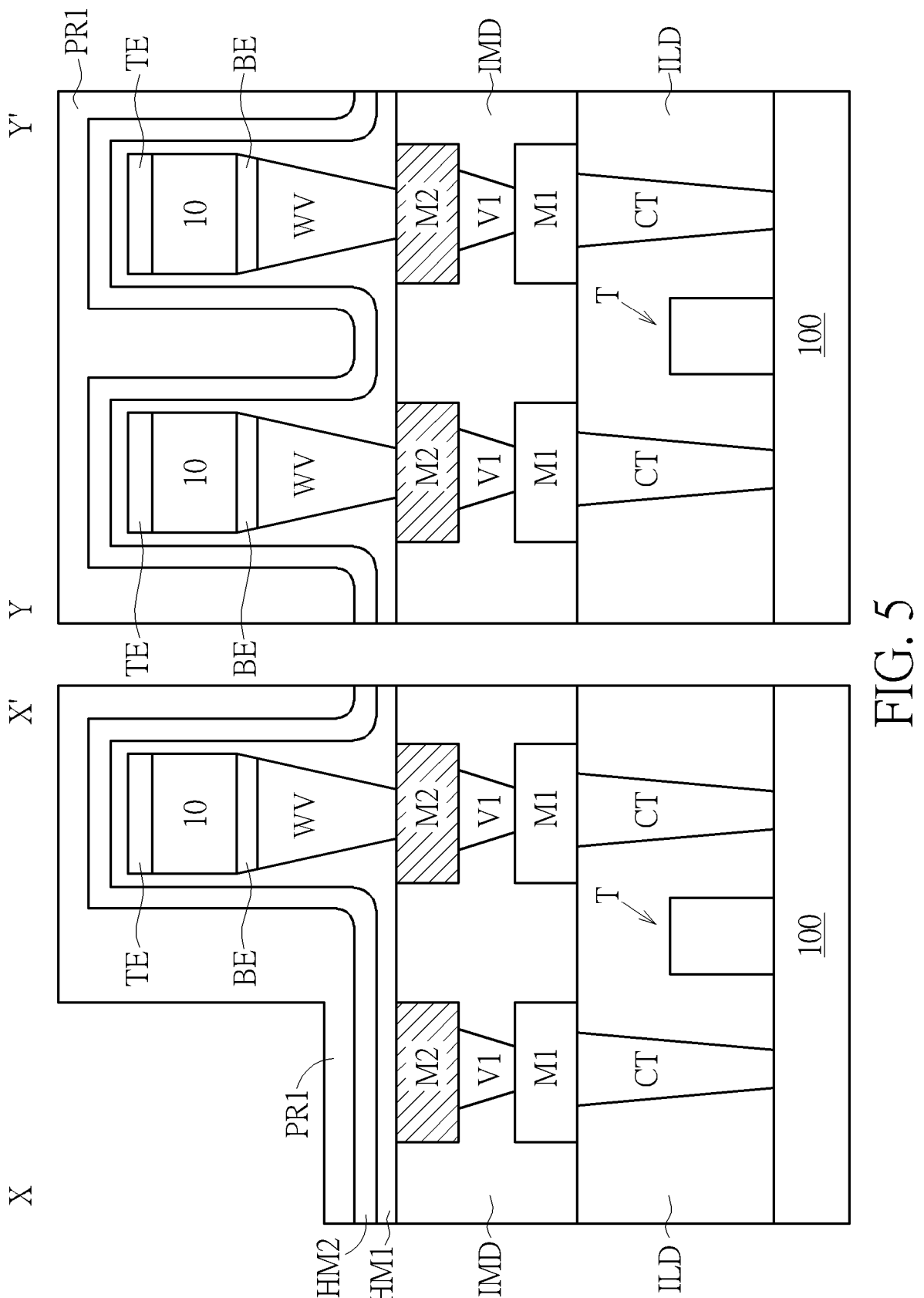
FIG. 5 shows a schematic cross-sectional structure after the first photoresist layer is formed according to the cross-sectional structure of FIG. 3.

FIG. 4 is a schematic top view of the semiconductor structure after the first photoresist layer is formed in the present invention. FIG. 5 shows a schematic cross-sectional structure after forming the first photoresist layer according to the cross-sectional structure of FIG. 3. Please refer to FIG. 4 and FIG. 5 together to form a first patterned photoresist layer PR1 covering each MTJ element 10. It is worth noting that the first patterned photoresist layer PR1 presents a plurality of strip patterns arranged in parallel, for example, covering each MTJ element 10 along the Y direction, but not covering the position where the second contact structure V2 is expected to be formed (the position where the second contact structure V2 is expected to be formed is indicated by dotted lines in FIG. 4, but it can be understood that the second contact structure V2 has not been formed at this time).

Figure 6:
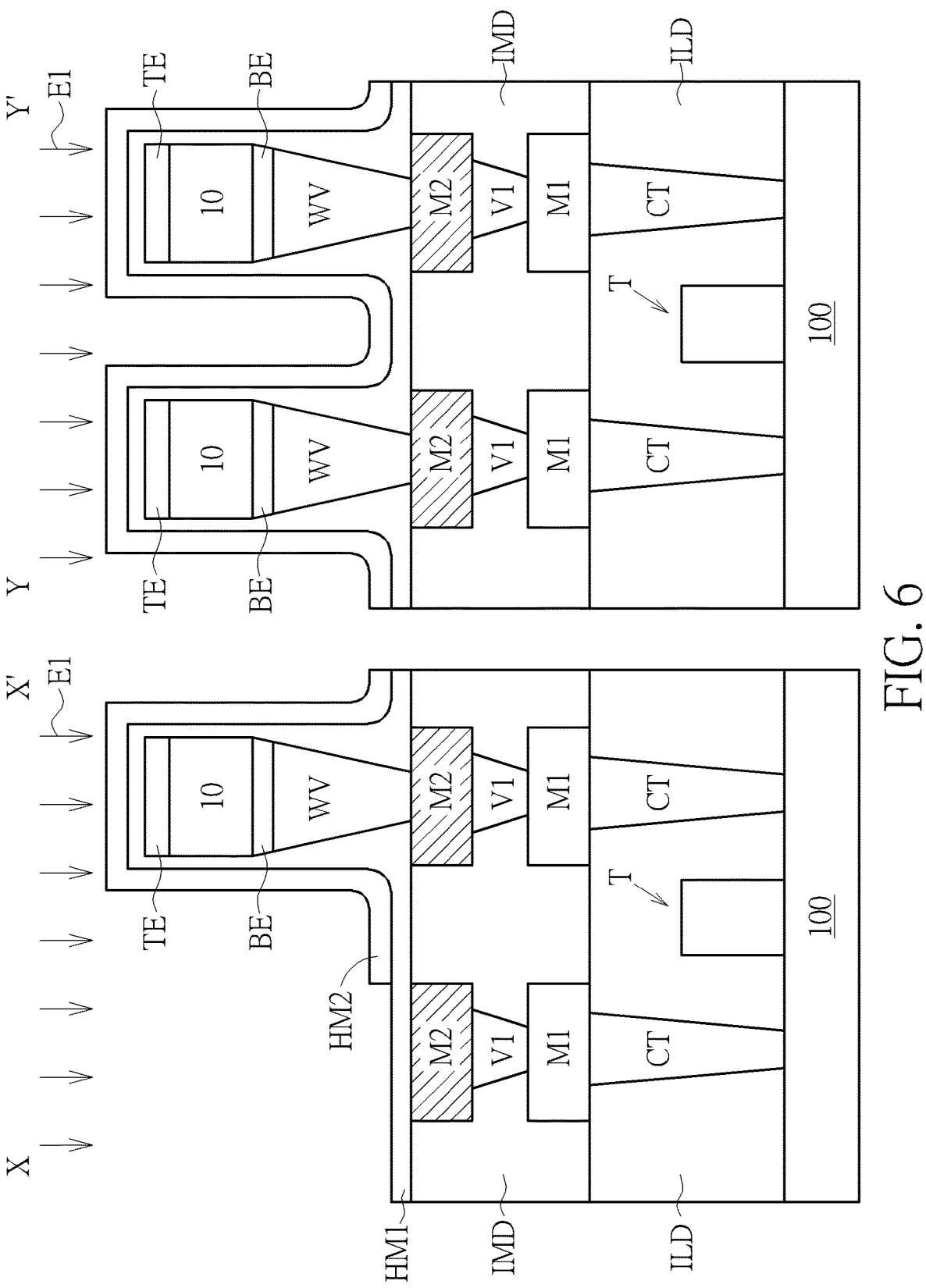
FIG. 6 shows a schematic cross-sectional structure after part of the second mask layer is removed according to the cross-sectional structure of FIG. 5.

FIG. 6 shows a schematic cross-sectional structure after removing part of the second mask layer according to the cross-sectional structure of FIG. 5. As shown in FIG. 6, using the first patterned photoresist layer PR1 as a mask, a first etching step E1 is performed to remove the second mask layer HM2 not covered by the first patterned photoresist layer PR1, and then the first patterned photoresist layer PR1 is removed. The etching step described here may include various dry etching or wet etching processes, and the etching step and the method of removing the photoresist are known in the art, so they will not be described here.

Figure 7:
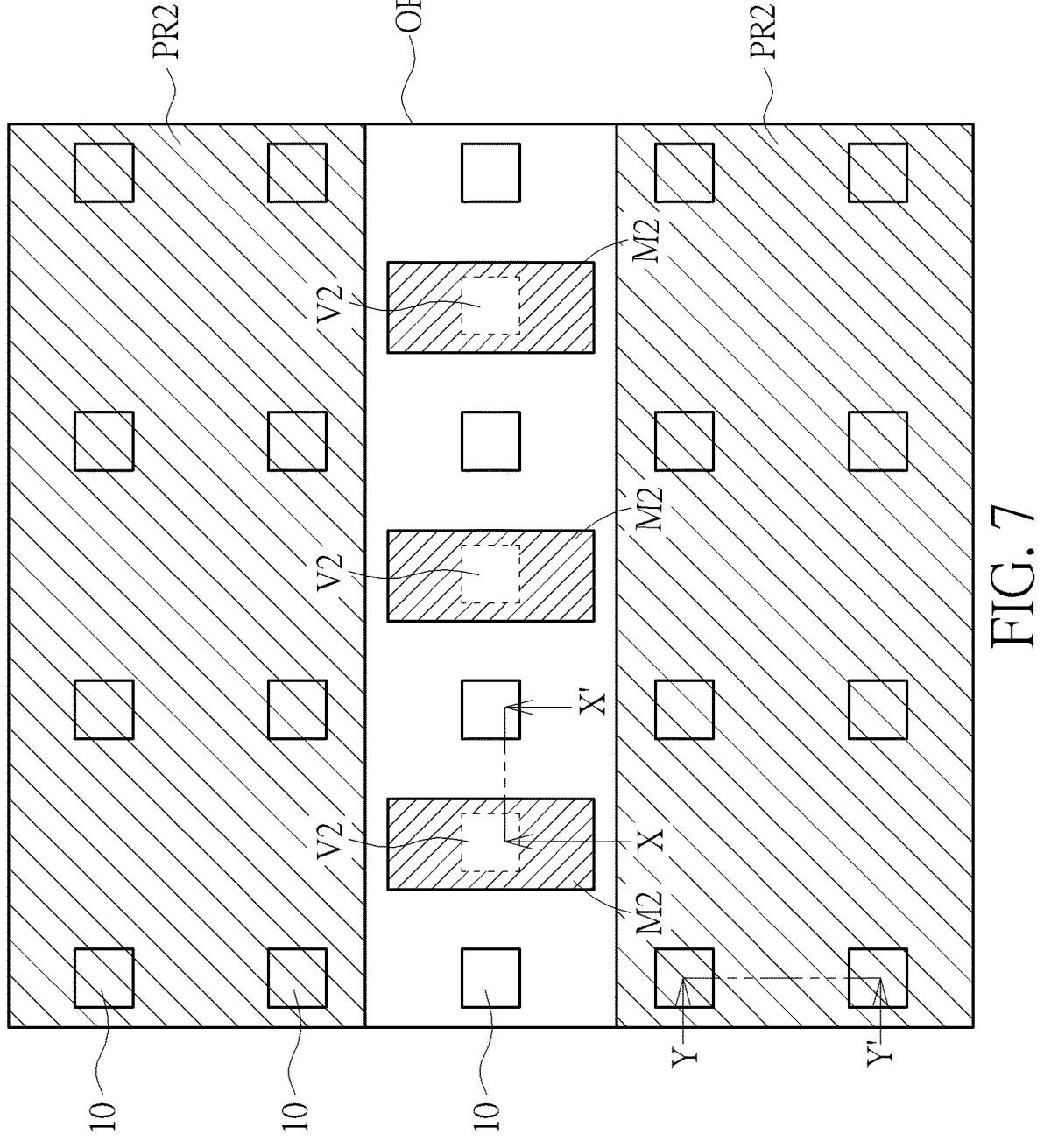
FIG. 7 is a schematic top view of the semiconductor structure after the second photoresist layer is formed in the present invention.
Figure 8:
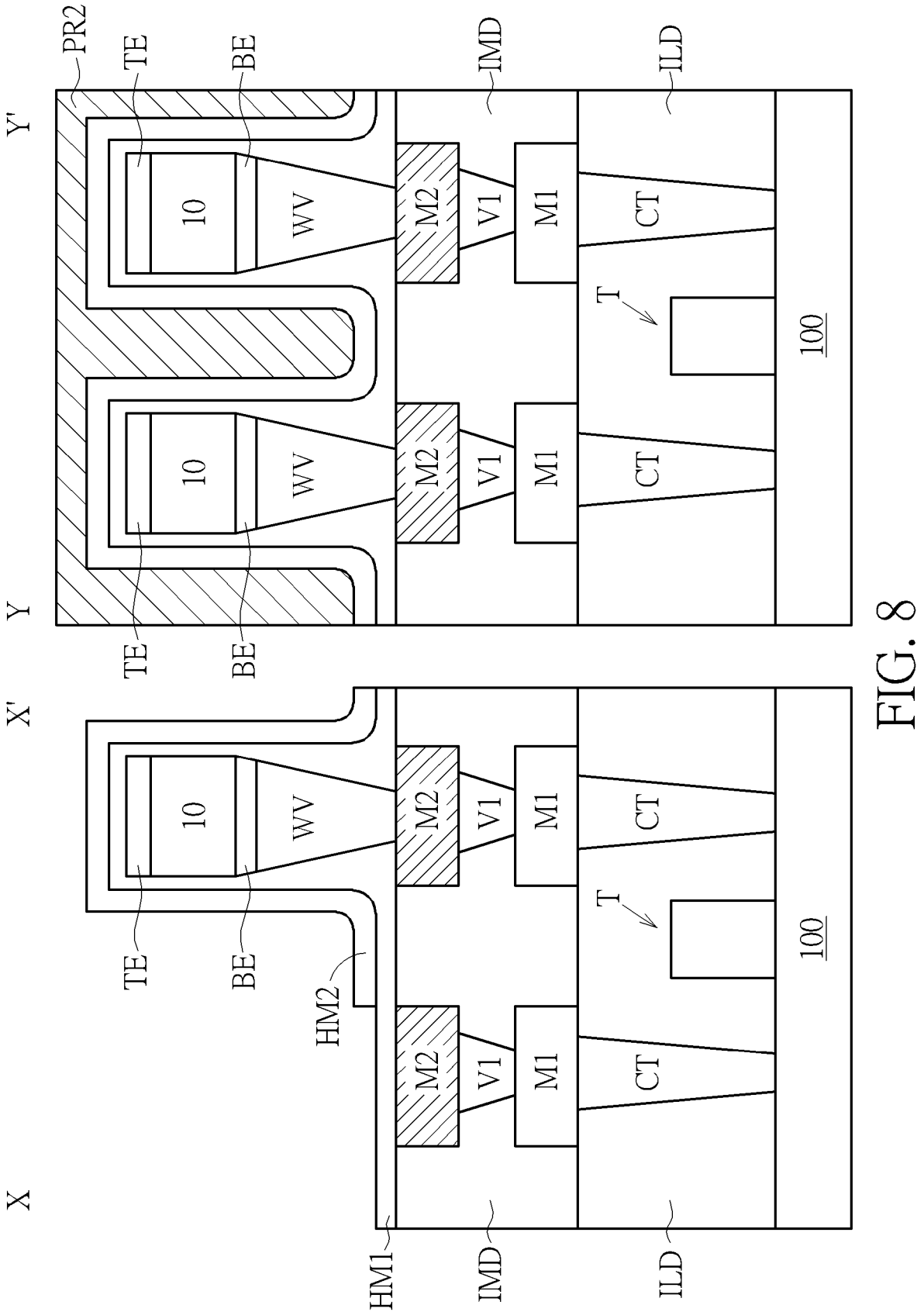
FIG. 8 shows a schematic cross-sectional structure after a second photoresist layer is formed according to the cross-sectional structure of FIG. 6.

FIG. 7 is a schematic top view of the semiconductor structure after the second photoresist layer is formed in the present invention. FIG. 8 shows a schematic cross-sectional structure after forming a second photoresist layer according to the cross-sectional structure of FIG. 6. Please refer to FIG. 7 and FIG. 8 together to form a second patterned photoresist layer PR2 covering part of the MTJ element 10. The second patterned photoresist layer PR2 includes an opening OP, and the opening OP exposes some of the MTJ elements 10, a portion of the second metal layer M2 and the position where the second contact structure V2 is scheduled to be formed along the X direction.

Subsequently, please refer to FIG. 9, which shows a schematic cross-sectional structure after removing part of the first mask layer and the second photoresist layer according to the cross-sectional structure of FIG. 8. A second etching step E2 is performed to remove part of the first mask layer HM1 that is not covered by the second mask layer HM2. At this time, all the mask layers at the top of the second metal layer M2 next to the MTJ element 10 in the X direction in FIG. 9 have been removed, so the surface of the second metal layer M2 is exposed.

It is worth noting that in this embodiment, when the first mask layer HM1 on the surface of the second metal layer M2 is removed, the surrounding sidewalls of the MTJ element 10 are still covered by the first mask layer HM1 and the second mask layer HM2, so that the MTJ element 10 can be effectively protected from etching. In addition, in this embodiment, preferably after the second etching step E2, the first mask layer HM1 and the second mask layer HM2 form a sidewall S1, wherein the sidewall S1 is aligned with the sidewall S2 of the second metal layer M2 along a vertical direction.

Figure 9:
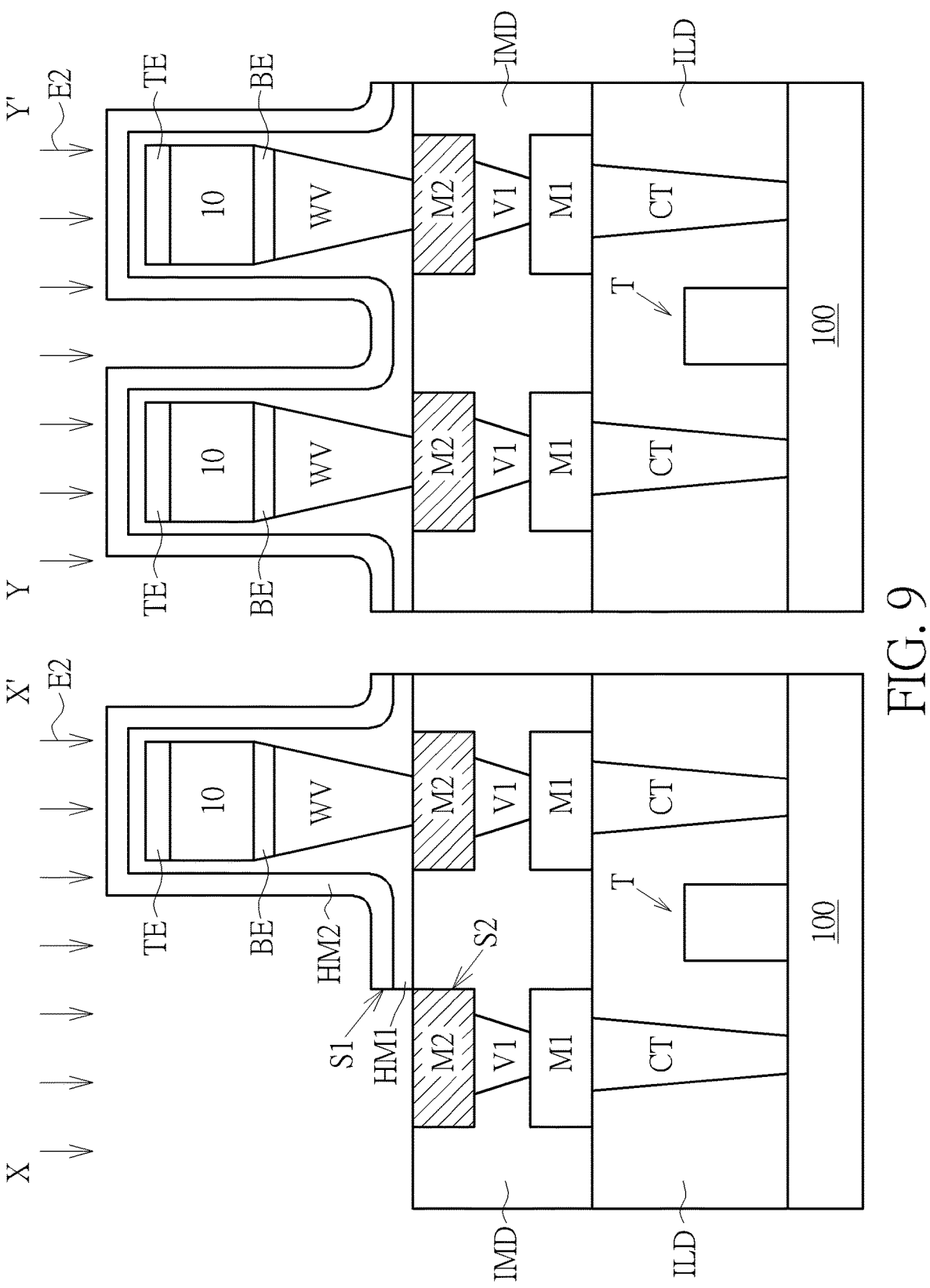
FIG. 9 shows a schematic cross-sectional structure after part of the first mask layer and the second photoresist layer are removed according to the cross-sectional structure of FIG. 8.
Figure 10:
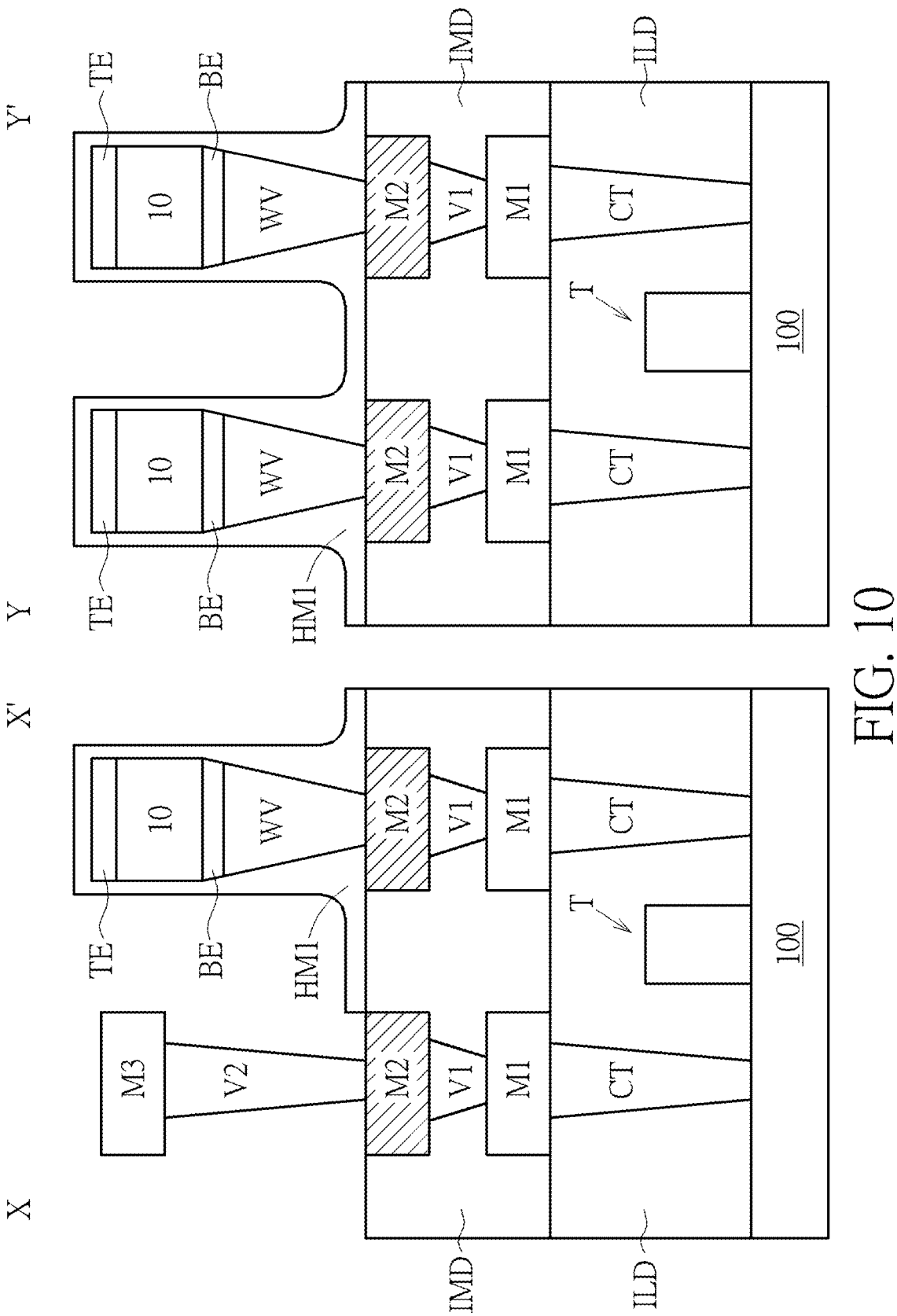
FIG. 10 shows a schematic cross-sectional structure after the second mask layer is completely removed and the second contact structure is formed according to the cross-sectional structure of FIG. 9.

FIG. 10 shows a schematic cross-sectional structure after the second mask layer is completely removed and the second contact structure is formed according to the cross-sectional structure of FIG. 9. As shown in FIG. 10, the second mask layer HM2 is completely removed, and a dielectric layer (not shown) is formed to cover the inter-metal dielectric layer IMD, then a second contact structure V2 is formed in the dielectric layer and electrically connected with the second metal layer M2, and a third metal layer M3 is formed to connect with the second contact structure V2. Here, the second contact structure V2 is equal to the second contact structure V2 shown in FIGS. 1-2. By the method of the invention, a closely spaced array of MTJ elements and a contact structures can be formed by using a double patterning and cutting method, without causing defects in element exposure.

Based on the above description and drawings, the invention provides a semiconductor structure, which comprises a plurality of magnetic tunnel junction (MTJ) elements 10. Seen from a top view, the MTJ elements 10 are arranged in an array, at least one second contact structure V2 is located in the array arranged by the MTJ elements 10, and at least one first mask layer HM1 covering a top surface and two sidewalls of each MTJ element 10, wherein a sidewall S1 of the first mask layer HM1 is aligned with a sidewall S2 of a second metal layer M2 below the second contact structure V2 when viewed from a cross-section view.

In some embodiments of the present invention, the array in which the MTJ elements 10 are arranged includes a plurality of columns, each column is arranged along a longitudinal direction (Y direction), and the plurality of columns includes a first column and a second column adjacent to each other, and the second contact structure V2 is located between the first column and the second column (refer to FIG. 2).

In some embodiments of the present invention, the first column contains a first MTJ element 10A and a third MTJ element 10C, and the second column contains a second MTJ element 10B and a fourth MTJ element 10D, wherein the distance X1 between the first and second MTJ elements 10A and 10B along a lateral direction (X direction) is equal to the distance between the third and fourth MTJ elements 10C and 10D along the lateral direction when viewed from the top.

In some embodiments of the present invention, a connection line L1 between the first and second MTJ elements 10A and 10B passes through the second contact structure V2 along the lateral direction, but a connection line L2 between the third and fourth MTJ elements 10C and 10D does not pass through the second contact structure (as shown in FIG. 2).

In some embodiments of the present invention, a plurality of contact structures WV are further included, and each contact structure WV is located below one of the MTJ elements and is electrically connected with the MTJ elements.

In some embodiments of the present invention, a bottom surface of the first mask layer HM1 is aligned with a top surface of the second metal layer M2.

In some embodiments of the present invention, each MTJ element is not located on the second metal layer M2.

The invention also provides a method for forming a semiconductor structure, which comprises the following steps: forming a plurality of magnetic tunnel junction (MTJ) elements 10, when viewed from a top view, the MTJ elements 10 are arranged in an array, at least a second metal layer M2 is formed and which is located in the array arranged by the MTJ elements 10. A first mask layer HM1 is formed to cover each MTJ element 10 and a top surface of the second metal layer M2, and a second mask layer HM2 is formed to cover the first mask layer HM1. A first etching step E1 is performed to remove the second mask layer HM2 disposed on the second metal layer M2, and a second etching step E2 is performed to remove the first mask layer HM1 disposed on the second metal layer M2 and expose the top surface of the second metal layer M2.

In some embodiments of the present invention, performing the first etching step E1 further includes forming a first patterned photoresist layer PR1, which includes a plurality of stripe patterns arranged along a longitudinal direction and covers each MTJ element 10, performing the first etching step E1, etching the areas not covered by the first patterned photoresist layer PR1, removing the second mask layer HM2 above the second metal layer M2, and removing the first patterned photoresist layer PR1.

In some embodiments of the present invention, performing the second etching step E2 further includes forming a second patterned photoresist layer PR2 covering a part of the plurality of MTJ elements 10, wherein the second patterned photoresist layer PR2 includes an opening OP extending in a lateral direction, and the opening exposes another part of the MTJ elements 10 and the second metal layer M2, performing the second etching step E2, etching the area not covered by the second patterned photoresist layer PR2, and removing the first mask layer above the second metal layer M2.

In some embodiments of the present invention, after the second etching step E2 is performed, the second mask layer HM2 is still covered on the first mask layer HM1, and a cross-sectional sidewall of the first mask layer HM1, a cross-sectional sidewall (the sidewall S1) of the second mask layer HM2 and a sidewall S2 of the second metal layer M2 are aligned with each other along the vertical direction.

In some embodiments of the present invention, after the second etching step E2, the first mask layer HM1 is further removed.

To sum up, the feature of the present invention is that in order to arrange the MTJ elements and the second contact structure more closely, the invention designs a special arrangement pattern of the MTJ element array and the second contact structure. The second contact structure is arranged in the lateral gap between the MTJ elements, and the size of the original array of MTJ elements is not changed. However, the short spacing of the pattern is easy to cause exposure defects in the process, so the invention also proposes a double patterning and cutting method. By the method of the invention, a closely spaced array of MTJ elements and contact structures can be formed without causing defects in element exposure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure comprising:
a plurality of magnetic tunnel junction (MTJ) elements, which are arranged in an array from a top view;
at least one second contact structure located in the array of the MTJ elements;
at least one first mask layer covering a top surface and two sidewalls of each MTJ element, wherein a sidewall of the first mask layer is aligned with a sidewall of a second metal layer below the second contact structure when viewed from a cross-section view.

2. The semiconductor structure according to claim 1, wherein when from the top view, the array in which the MTJ elements are arranged comprises a plurality of rows, each row being arranged along a longitudinal direction, and the plurality of rows comprises a first row and a second row adjacent to each other, and the second contact structure is located between the first row and the second row.

3. The semiconductor structure according to claim 2, wherein the first row includes a first MTJ element and a third MTJ element, and the second row includes a second MTJ element and a fourth MTJ element, wherein the distance between the first MTJ element and second MTJ element along a lateral direction is equal to the distance between the third MTJ element and fourth MTJ element along the lateral direction when viewed from the top view.

4. The semiconductor structure according to claim 3, wherein a connection line between the first MTJ element and second MTJ element passes through the second contact structure along the lateral direction, but a connection line between the third MTJ element and fourth MTJ element does not pass through the second contact structure.

5. The semiconductor structure according to claim 1, further comprising a plurality of contact structures, each contact structure is located below one of the MTJ elements and electrically connected with the MTJ elements.

6. The semiconductor structure according to claim 1, wherein a bottom surface of the first mask layer is aligned with a top surface of the second metal layer.

7. The semiconductor structure according to claim 1, wherein each of the MTJ elements is not located on the second metal layer.

\* \* \* \* \*